(12) United States Patent
Templeman et al.

(10) Patent No.: US 9,274,429 B2
(45) Date of Patent: Mar. 1, 2016

(54) METHOD FOR PRODUCING LAYERED MATERIALS USING LONG-LIVED PHOTO-INDUCED ACTIVE CENTERS

(71) Applicants: Toyota Motor Engineering & Manufacturing North America, Inc., Erlanger, KY (US); University of Iowa Research Foundation, Iowa City, IA (US)

(72) Inventors: Cynthia G. Templeman, Ypsilanti, MI (US); Alec B. Scranton, Coralville, IA (US); Beth Ann Rundlett, Norwalk, IA (US); Cynthia Hoppe, Amana, IA (US)

(73) Assignees: Toyota Motor Engineering & Manufacturing North America, Inc., Erlanger, KY (US); University of Iowa Research Foundation, Iowa City, IA (US)

( * ) Notice: Subject to any disclaimer, the term of this patent is extended or adjusted under 35 U.S.C. 154(b) by 0 days.

(21) Appl. No.: 14/334,873

(22) Filed: Jul. 18, 2014

(65) Prior Publication Data

US 2014/0329182 A1   Nov. 6, 2014

Related U.S. Application Data

(62) Division of application No. 12/555,933, filed on Sep. 9, 2009, now abandoned.

(51) Int. Cl.
*G03F 7/16* (2006.01)
*B05D 1/36* (2006.01)
*B05D 1/38* (2006.01)

(Continued)

(52) U.S. Cl.
CPC .. *G03F 7/16* (2013.01); *B05D 1/36* (2013.01); *B05D 1/38* (2013.01); *B05D 3/067* (2013.01); *C08F 2/48* (2013.01); *G03F 7/2002* (2013.01); *B05D 7/53* (2013.01); *B05D 2202/10* (2013.01)

(58) Field of Classification Search
CPC .............. B05D 1/38; B05D 3/067; C08F 2/48
See application file for complete search history.

(56) References Cited

U.S. PATENT DOCUMENTS

| 4,105,806 A | 8/1978 | Watt |
| 4,156,035 A | 5/1979 | Tsao et al. |

(Continued)

FOREIGN PATENT DOCUMENTS

| JP | 2007083201 A | 4/2007 |
| JP | 2008170697 A | 7/2008 |

(Continued)

*Primary Examiner* — Elena T Lightfoot
(74) *Attorney, Agent, or Firm* — Dinsmore & Shohl LLP

(57) ABSTRACT

The invention relates to a method for applying a photo-activated layered polymer coating to a substrate material in which one or more layers do not contain photoinitiator, or are not exposed to initiating light, but cure due to migration of cationic active centers. At least two separate monomer layers are applied to the substrate material. At least one of the monomer layers includes a photoinitiator capable of producing cationic active centers. The at least one layer including the photoinitiator is exposed to a source of UV radiation at a desired wavelength forming cationic active centers. The at least two separate monomer layers react in a polymerization reaction forming a cured layered material. The cationic active centers of the exposed monomer layer migrate to the unexposed layer such that both layers cure via the polymerization reaction.

18 Claims, 2 Drawing Sheets

(51) Int. Cl.
   *B05D 3/06*   (2006.01)
   *C08F 2/48*   (2006.01)
   *G03F 7/20*   (2006.01)
   *B05D 7/00*   (2006.01)

(56) References Cited

U.S. PATENT DOCUMENTS

| | | | |
|---|---|---|---|
| 4,164,487 A | | 8/1979 | Martin |
| 4,348,462 A | | 9/1982 | Chung |
| 5,006,397 A | * | 4/1991 | Durand .................. 428/209 |
| 5,116,876 A | | 5/1992 | Davidson et al. |
| 5,148,742 A | | 9/1992 | Stirbis et al. |
| 5,276,537 A | | 1/1994 | Savant et al. |
| 5,403,869 A | * | 4/1995 | Arike et al. .................. 522/25 |
| 5,545,676 A | | 8/1996 | Palazzotto et al. |
| 6,506,869 B2 | | 1/2003 | Yamaguchi et al. |
| 6,716,891 B1 | | 4/2004 | Meisenburg et al. |
| 7,048,651 B2 | | 5/2006 | Kennedy, III et al. |
| 7,053,133 B2 | | 5/2006 | Yamaguchi et al. |
| 2005/0267264 A1 | | 12/2005 | Takei et al. |

FOREIGN PATENT DOCUMENTS

| | | |
|---|---|---|
| JP | 2008170822 A | 7/2008 |
| WO | 85/01947 A1 | 5/1985 |

* cited by examiner

METHOD FOR PRODUCING LAYERED MATERIALS USING LONG-LIVED PHOTO-INDUCED ACTIVE CENTERS

CROSS REFERENCE TO RELATED APPLICATION(S)

This application is a divisional application of U.S. Ser. No. 12/555,933 filed Sep. 9, 2009, now abandoned.

FIELD OF THE INVENTION

The invention relates to a method for applying a photo-activated layered polymer coating to a substrate material.

BACKGROUND OF THE INVENTION

It is known to use polymer coatings on various substrate materials. Typically, these coatings are produced using thermally activated polymerization. Heat is used to generate active centers that polymerize the coatings after a monomer has been applied to a substrate as a liquid. However, thermal polymerization requires large amounts of energy, time and expense to run high temperature ovens for extended periods of time.

It is also known to use photopolymerization to produce polymer coatings on substrates. Photopolymerization reactions are chain reactions which generate free radical or cationic active centers. In photopolymerization, energy from UV or visible light is used to polymerize the monomer. Photopolymerization has a number of advantages including savings in energy and high cure rates without the necessity of solvents.

However, photopolymerization of coatings on various substrates has not been successful because of problems with oxygen inhibition. Previously known photopolymerization systems generally have used free radical polymerization to generate free radical active centers. The free radical active centers may react with oxygen to produce unreactive peroxides and hydroperoxides. This results in a decrease in the polymerization rate and a reduction in molecular weight of the polymer. The oxygen inhibition may cause free radical polymerizations to exhibit an incomplete cure resulting in deficient coatings. A typical method for overcoming oxygen inhibition is to purge the system with nitrogen in an attempt to displace the oxygen from the monomer. Coatings having multiple layers would require nitrogen purging for each layer also requiring more than one illumination step.

Additionally, photopolymerization may also exhibit deficiencies in curing systems having pigments. Pigments may be used in a coating to provide color or to cover the surface of a substrate. Pigments may inhibit photopolymerization by directly competing with a photoinitiator absorption. Additionally, pigments may interact with light to scatter photons in multiple directions resulting in increased light attenuation for pigmented coatings. There is therefore a need in the art for an improved method of forming a layered coating that may be used in pigmented coatings. There is also a need in the art for an improved method of applying a layered coating that eliminates the need for multiple illumination steps and nitrogen purging steps.

SUMMARY OF THE INVENTION

Accordingly, the invention relates to a method of effectively producing a polymerized coating on a substrate material. The method is particularly useful for coating objects with a coating having pigments contained therein.

In one aspect, the method includes the steps of providing a substrate material, applying at least two separate monomer layers to the substrate material, at least one of the monomer layers including a photoinitiator capable of producing cationic active centers. The layer including the photoinitiator is exposed to a source of UV radiation at a desired wavelength forming cationic active centers. The at least two separate monomer layers react in a polymerization reaction forming a cured layered material.

In another aspect, the method of forming a layered material includes the steps of providing a substrate material. A base coat is applied to the substrate material. A clear coat layer is applied to the base coat layer with the clear coat layer including a photoinitiator capable of producing cationic active centers. The clear coat layer is then exposed to a source of UV radiation at a desired wavelength forming cationic reaction centers. The base coat and clear coat layers react in a polymerization reaction forming a cured layered material.

DETAILED DESCRIPTION OF THE PREFERRED EMBODIMENTS

Figure 1:
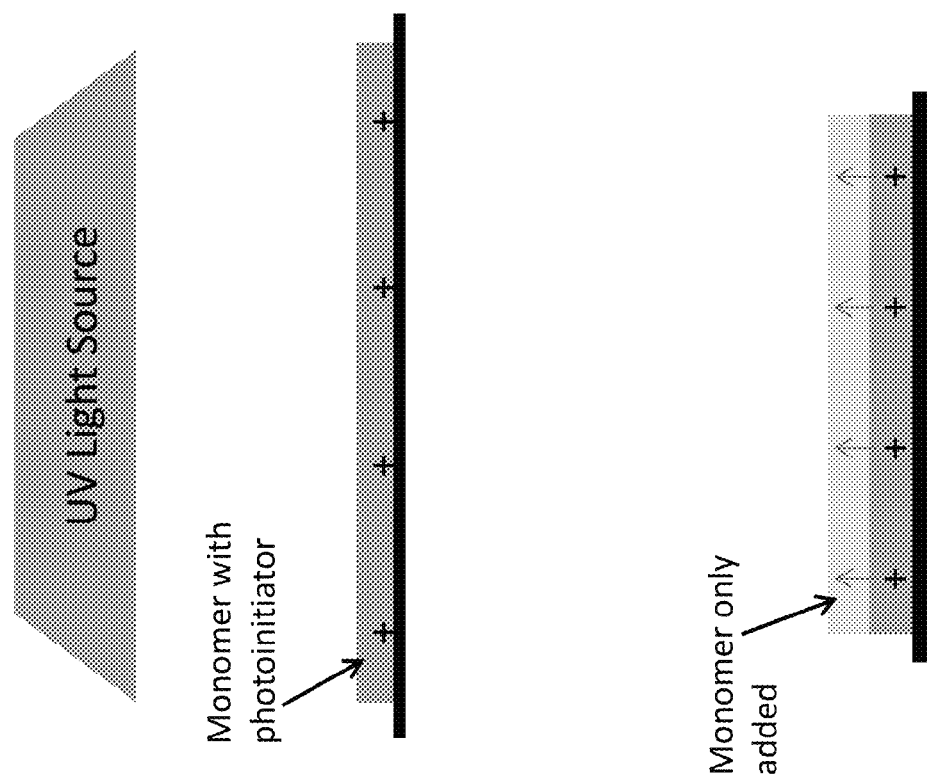
FIG. 1 is a graphic representation of one embodiment of the method wherein a bottom layer applied to a substrate contains a monomer and photoinitiator that is illuminated followed by a second layer of monomer which cures without further illumination.
Figure 2:
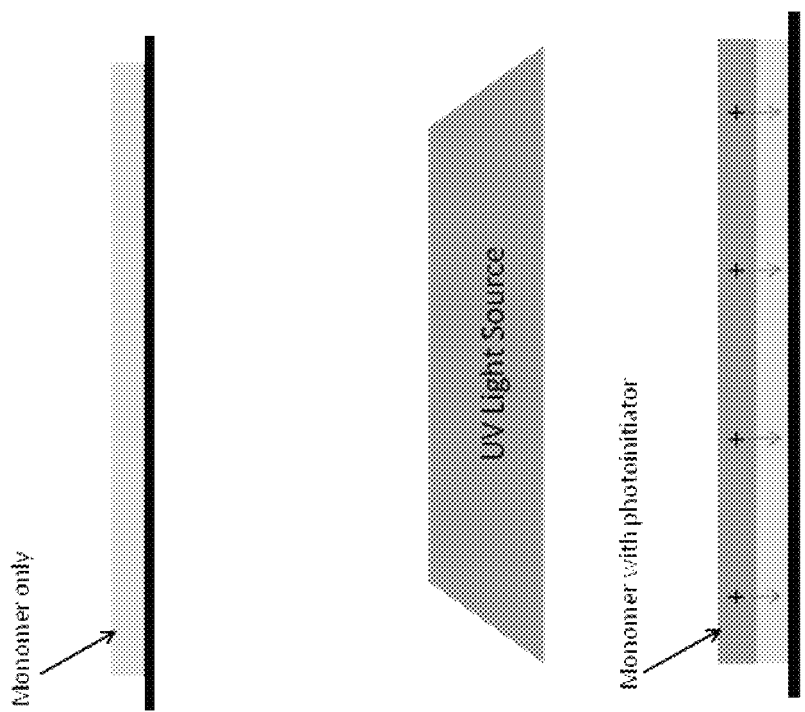
FIG. 2 is a graphic representation of the method in which a bottom layer of monomer is applied to a substrate followed by a second layer of monomer containing a photoinitiator which is then illuminated resulting in a cure of the bottom and top layers.

Referring to FIGS. 1 and 2, there is shown graphic representations of a method of forming a layered material on a substrate. The method includes providing a substrate material. At least two separate monomer layers are applied to the substrate material. At least one of the monomer layers includes a photoinitiator capable of producing cationic active centers upon illumination with light of the appropriate wavelength. The at least one layer including the photoinitiator is exposed to a source of UV radiation at a desired wavelength. The at least two separate monomer layers react in a polymerization reaction forming a cured layered material. In one aspect, the cationic active centers of the exposed monomer layer migrate to the unexposed layer such that both layers cure via a polymerization reaction.

Various cationic photoinitiators and cationically curable monomers may be utilized. In one aspect, any photoinitiator capable of initiating a cationic polymerization reaction of the monomers by absorbing light from a predetermined light source may be utilized. Various cationic photoinitiators may include but are not limited to diazonium salts, diaryliodonium salts, triarylsulphonium salts, dialkylphenacyl-sulfonium salts, ferrocenium salts, α-sulphonyloxy ketones, or silyl benzyl ethers.

As stated above, various cationically curable monomers may be utilized. In one aspect, the polymerization may be with any monomer or combination of monomers that undergo cationic polymerization. Various monomers that may be cationically polymerized include but are not limited to mono-functional or difunctional epoxides, high molecular weight epoxy oligomers and resins, cyclic sulphides, vinyl ethers, cyclic ethers, cyclic formals and acetals, lactones, or siloxanes. In one aspect, the monomer component can comprise a combination of cycloaliphatic diepoxide (3,4-epoxy-cyclohexylmethanyl 3,4-epoxycyclohexane-carboxylate) and a glycidyl ether (2-butoxymethyl-oxirane). It should be realized that the desired selection and amounts of monomer may depend upon the desired polymer to be formed on the substrate.

The photoinitiator may be present in the at least one monomer layer in an amount that is effective or sufficient to enable the monomer to undergo a photopolymerization upon exposure to light of a desired wavelength. In one aspect, the photoinitiator may be present in an amount of from 0.5 to 6 weight percent relative to the monomer. In another aspect, the photoinitiator may be present in a preferable amount of from 0.5 to 2 and even more preferably from 0.8 to 1.2 weight percent.

The monomer layers may be applied to the substrate and other layers using various application methods. Included application methods include spraying, knife coating, brushing, flow coating, dipping, or rolling. In one aspect a preferred method is spray application which may include compressed air spraying, airless spraying, high speed rotation, or electrostatic spray application. The layers applied to the substrate and subsequent layers may have varying thicknesses depending on the application method. In one aspect, the thickness of the monomer layers may be from 5 to 150 micrometers, preferably between 40 to 60 micrometers.

Referring to FIG. 1, there is shown a graphic representation of the method in which a first layer is applied to a substrate material with the first monomer layer including the photoinitiator. The first monomer layer is exposed to a source of UV radiation curing the first monomer layer. Next, a second layer of monomer is applied to the cured first layer such that the second layer cures without further exposure to UV radiation.

Referring to FIG. 2, there is shown another graphic representation of the method. In this representation, a first monomer layer is applied to the substrate material. A second monomer layer is applied to the first layer with the second layer including the photoinitiator. The second layer is then exposed to a source of UV radiation curing the first and second monomer layers without exposing the first monomer layer to UV radiation directly.

While the graphic representations of FIGS. 1 and 2 include two layers applied to a substrate, it should be realized that a plurality of layers may be applied to a substrate material with at least one of the plurality of layers including a photoinitiator. The at least one layer including the photoinitiator may be exposed to a source of UV radiation at a desired wavelength. All the separate monomer layers of the plurality may react in a polymerization reaction forming a cured layered material. In one aspect, at least one of the layers may include a pigment. The pigment may be contained in the layer including the photoinitiator without affecting the curing of the cured layered material.

The method of the invention may be utilized in base coat and clear coat systems. In one aspect, a substrate may include steel having an electrocoated layer applied thereon. A first base coat layer may be applied to the substrate. The base coat layer may include various monomers, solvents and pigments. A clear coat layer may be applied to the base coat layer with the clear coat including the photoinitiator. The clear coat may then be exposed to a source of UV radiation at a desired wavelength such that both the clear coat layer and base coat layer are cured in a polymerization reaction.

EXAMPLES

Example 1

The experimental setups are illustrated in FIGS. 1 and 2. In the first set of experiments, FIG. 1, the bottom layer only of a two-layer coating was illuminated. A mixture of epoxide monomers used for cationic photopolymerization was mixed with 1% by weight of the cationic photoinitiator (tolycumyl) iodonium tetrakis(pentafluorophenyl)borate (IPB, Secant Chemicals) and sprayed onto an aluminum substrate using an airbrush. The monomer mixture contained 70% by weight 3,4-epoxy-cyclohexylmethanyl 3,4-epoxycyclohexane-carboxylate (CDE, Dow Chemical Co.) and 29% by weight 2-butoxymethyl-oxirane (BMO, Hexion Specialty Co.). This experiment was conducted both with and without an additional 1% by weight of the pigment Titanium Dioxide ($TiO_2$) added to the monomer/photoinitiator mixture in the bottom layer. This layer was then irradiated for 10 minutes using a 200 W Oriel Hg—Xe arc lamp with a measured irradiance of ~50.0 mw/$cm^2$. A layer of the same monomer mixture containing no photoinitiator was then sprayed on top of the cured layer. The coated panels were stored at atmospheric conditions and room temperature, and monitored to determine the time required to obtain a tack-free surface. Once polymerized, the thickness of the coating was measured using a micrometer (micro-TR1-gloss μ, BYK Gardner).

Example 2

In the second set of experiments, FIG. 2, the top layer only of a two-layer coating was illuminated. A mixture containing 70% by weight CDE and 30% by weight BMO was sprayed onto an aluminum substrate using an airbrush. A second layer containing the same monomer mixture with 1% by weight IPB photoinitiator was sprayed over the top of the unpolymerized bottom layer. This experiment was conducted both with and without an additional 1% by weight of the pigment $TiO_2$ added to the monomer/photoinitiator mixture in the top layer. The two-layer coating was then irradiated for 10 minutes using the Hg—Xe arc lamp. The photopolymerization was carried out under atmospheric conditions and at room temperature. The coated panels were monitored to determine the time required to obtain a tack-free surface. Once polymerized, the thickness of the coating was measured using a micrometer.

Table 1 summarizes the experimental results for the first set of experiments, where only the bottom layer was illuminated and the active centers diffused into the top layer (which was applied post-illumination), resulting in overall cure and full property development for both layers. Results are shown for two coatings, one with and one without the pigment $TiO_2$ added to the illuminated layer.

TABLE 1

Results of shadow cure through multiple layers: bottom layer illuminated only

| Bottom Layer | Top layer | Bottom layer exposure time (min) | Top layer time to tack-free (hrs) | Bottom layer average thickness(μm) | Total avg. thickness with top layer (μm) |
|---|---|---|---|---|---|
| CDE/BMO/ 1 wt % IPB | CDE/ BMO | 10 | 1-2 | 29.9 | 51.8 |
| CDE/BMO/ 1 wt % IPB/ 1 wt % $TiO_2$ | CDE/ BMO | 10 | 1-2 | 36.8 | 61.1 |

Table 2 summarizes the results for the second set of experiments, where two layers were sprayed onto the panels and then illuminated. In these experiments, the bottom layer contained only monomer (no initiator). The top layer, containing photoinitiator, was illuminated, resulting in overall cure and full property development for both layers. Results are shown for two coatings, one with and one without the pigment $TiO_2$ added.

TABLE 2

Results of shadow cure through multiple layers: top layer illuminated only

| Bottom Layer | Top layer | Top layer exposure time (min) | Time to tack-free (hrs) | Total avg. thickness with top layer (μm) |
|---|---|---|---|---|
| CDE/BMO | CDE/BMO/ 1 wt % IPB | 10 | 0 | 60.4 |
| CDE/BMO | CDE/BMO/ 1 wt % IPB/ 1 wt % $TiO_2$ | 10 | 0 | 82.9 |

In both sets of experiments, the cationic active centers were able to diffuse into an unilluminated layer containing no photoinitiator. The driving force for this phenomenon is considered to be the concentration gradient between the two layers. The films cured completely within 1-2 hours regardless of the constituents of the layers, and the cure time was not affected by the presence of pigment in the illuminated layer. The results of these experiments have shown this invention to be a novel use of cationic photopolymerization for curing multi-layer coatings.

Example 3

Simulated Clearcoat

To simulate a clearcoat, a cycloaliphatic diepoxide (3,4-epoxycyclohexylmethyl 3,4-epoxycyclohexane carboxylate, such as Genomer 7210 from Rahn), was mixed with epoxidized linseed oil (Vikoflex 7190 from Arkema) in a 50/50 by weight ratio, giving a total of 53.1436 g of material. Next, 2.5423 g of oxetane alcohol (3-ethyl-3-hydroxymethyl-oxetane, OXT-101 from Toagosei) was added to the resin mixture. Next, 2.6555 g of limonene dioxide (Arkema) was added to the mixture. Next, 3.0532 g of a photoinitiator solution of triarylsulfonium hexafluoroantimonate salts in propylene carbonate (50/50 by weight mixture), such as UVI6976 from Dow Chemical, was added to the resin mixture. Finally, 1.8820 g of a Tinuvin 400 solution, a hydroxyphenyl-triazine type UV-absorbing solution was added to the mixture. The Tinuvin 400 solution consisted of 48% by weight of Tinuvin 400 (Ciba Specialty Chemicals) dissolved in a common paint solvent blend, containing mainly 1-methoxy-2-propyl acetate, toluene, methyl ethyl ketone, VM and P naphtha, as well as small quantities of other solvents. The simulated clearcoat was mixed using a FlackTek DAC 150 FVZ-K SpeedMixer for 1.5 minutes at approximately 2500 rpm.

Simulated Basecoat

To simulate a basecoat, 24.7016 g of both 3,4-epoxycyclohexylmethyl 3,4-epoxycyclohexane carboxylate and epoxidized linseed oil was mixed to give 49.4032 g of material. Next, 2.3581 g of oxetane alcohol and 3.0233 g of limonene dioxide were added to the resin mixture. Finally, 2.0484 g of aluminum flake paste (Metalure from Eckart America) was added. This simulated basecoat was mixed for 1.5 minutes at approximately 2500 rpm using the FlackTek SpeedMixer.

Test Panel Preparation

Cold rolled steel panels with PPG ED6650 electrocoat (APR41968 from ACT Test Panels) were prepared for spraying by applying two masking tape strips to each (to facilitate coating thickness measurement after curing). No further surface preparation was done. The simulated basecoat was sprayed with a DeVilbiss HVLP spraygun, at 62 psi onto the test panels. The first tape strip was then removed from each panel. The simulated clearcoat was then sprayed over the wet basecoat, using the same spraygun and conditions. Finally, the second piece of tape was removed from the panels.

Curing

Panels were cured using two different conditions. One panel was cured at 4 feet/minute using a Fusion UV Conveyor System with a 13 mm H bulb. Total energy in the UVB range (280-320 nm) was approximately 3.46 $J/cm^2$, and in the UVA range (320-390 nm) the total energy was approximately 3.85 $J/cm^2$. The second panel was cured at 10 feet/minute. The total energy in the UVB range was approximately 1.51 $J/cm^2$ and the total energy in the UVA range was approximately 1.81 $J/cm^2$. Radiometry was measured with an EIT PowerPuck.

Evaluation

Immediately after each panel came out of the conveyor, it was observed for appearance, tackiness, and a subjective "ease of gouging" with a small plastic implement. The panel which was cured at 4 feet/minute was not tacky, the clearcoat was hard, and difficult to gouge through. The panel cured at 10 feet/minute was also not tacky, but it was easier to gouge.

Example 4

Multi Layer Coating

Bottom and Top Layer Material Composition

A mixture was made with the following weight percentages: bis(3,4-epoxycyclohexylmethyl) adipate (such as UVR6128 from Dow Chemical) 53.1%; epoxidized linseed oil (such as Vikoflex 7190 from Arkema) 42.2%; and limonene dioxide (from Arkema) 4.7%.

Middle Layer Material Composition

A mixture was made with the following weight percentages: bis(3,4-epoxycyclohexylmethyl) adipate (such as UVR6128 from Dow Chemical) 85.5%; epoxidized linseed oil (such as Vikoflex 7190 from Arkema) 9.3%; and triarylsulfonium hexafluoroantimonate salt photoinitiator (such as UVI6976 from Dow Chemical) 5.2%.

Test Panel Preparation

Three cold rolled steel panels with PPG ED6650 electrocoat (APR41968 from ACT Test Panels) were used for testing. No surface preparation was done. The top/bottom layer material was drawn down on each panel using a 13 μm wire wound rod. Next, the middle layer material was sprayed wet-on-wet over the bottom layer. Finally, the top/bottom layer material was sprayed wet-on-wet over the middle layer.

Curing

Panels were cured using three different conditions. One panel was cured at 4 feet/minute using a Fusion UV Conveyor System with a 13 mm H bulb. Total energy in the UVB range (280-320 nm) was approximately 3.5 $J/cm^2$, and in the UVA range (320-390 nm) the total energy was approximately 4.0 $J/cm^2$. The second panel was cured at 10 feet/minute. The total energy in the UVB range was approximately 1.5 $J/cm^2$ and the total energy in the UVA range was approximately 1.8 $J/cm^2$. The third panel was cured at 20 feet/minute, with total UVB energy approximately 0.8 $J/cm^2$ and total UVA energy approximately 0.9 $J/cm^2$. Radiometry was measured with an EIT PowerPuck.

Evaluation

Immediately after each panel came out of the conveyor, it was observed for appearance, tackiness, and a subjective "ease of gouging" with a small plastic implement. All three panels were dry (not tacky) and hard. Both the 4 ft/min and the 10 ft/min panels would not gouge indicating that the bottom layer was cured. Immediately after coming out of the conveyor, the 20 ft/min panel could be very slightly gouged, but after about 30 seconds, it could not be gouged. Total thickness for the panels ranged from 45-60 μm.

While the above examples provide a description of the process of the present invention, they should not be read as limiting the process of the present invention. The invention has been described in an illustrative manner. It is to be understood that the terminology which has been used is intended to be in the nature of words of description rather than limitation. Many modifications and variations of the invention are possible in light of the above teachings. Therefore, within the scope of the appended claims, the invention may be practiced other than as specifically described.

The invention claimed is:

1. A method of forming a layered material on a substrate comprising the steps of:
   providing a substrate material;
   applying at least two separate monomer layers to the substrate material, at least one of the monomer layers including a photoinitiator capable of producing cationic active centers;
   applying a first of the at least two monomer layers to the substrate material, the first monomer layer including the photoinitiator;
   exposing only the first monomer layer to a source of UV radiation at a desired wavelength forming cationic active centers;
   applying a second monomer layer of the at least two monomer layers to the exposed first layer wherein the second layer cures with no further exposure to UV radiation;
   wherein the at least two separate monomer layers react in a polymerization reaction forming a cured layered material wherein the curing of the two separate monomer layers occurs at room temperature.

2. The method of claim 1 wherein the cationic active centers of the exposed monomer layer migrate to the unexposed layer wherein both layers cure via a polymerization reaction.

3. The method of claim 1 wherein at least one of the layers includes a pigment.

4. The method of claim 3 wherein the first monomer layer including the photoinitiator includes the pigment.

5. The method of claim 1 wherein the substrate includes steel having an electro-coated layer applied thereon.

6. The method of claim 1 wherein the monomer layers are selected from:
   monofunctional or difunctional epoxides, epoxy oligomers and resins, cyclic sulphides, vinyl ethers, cyclic ethers, cyclic formals and acetals, lactones, or siloxanes.

7. The method of claim 1 wherein the monomer layers have a cured thickness of from 5 to 150 micrometers.

8. The method of claim 1 wherein the photoinitiator is selected from the group consisting of diazonium salts, diaryliodonium salts, triarylsulphonium salts, dialkylphenacyl-sulfonium salts, ferrocenium salts, α-sulphonyloxy ketones, and silyl benzyl ethers.

9. The method of claim 1 wherein the photoinitiator is present in an amount of about 0.5 to 6 weight percent relative to the monomer.

10. A method of forming a layered material on a substrate comprising the steps of:
    providing a substrate material;
    applying a plurality of monomer layers to the substrate material, at least one of the plurality of layers including a photoinitiator capable of producing cationic active centers;
    exposing the layer including the photoinitiator to a source of UV radiation at a desired wavelength forming cationic active centers;
    applying additional monomer layers to the exposed layer wherein the plurality of layers react in a polymerization reaction forming a cured layered material wherein the curing of the plurality of monomer layers occurs at room temperature.

11. The method of claim 10 wherein the cationic active centers of the exposed monomer layer migrate to the unexposed layers wherein the plurality of layers cure via a polymerization reaction.

12. The method of claim 10 wherein at least one of the layers includes a pigment.

13. The method of claim 12 wherein the at least one layer including the photoinitiator includes the pigment.

14. The method of claim 10 wherein the substrate includes steel having an electro-coated layer applied thereon.

15. The method of claim 10 wherein the monomer layers are selected from:
    monofunctional or difunctional epoxides, epoxy oligomers and resins, cyclic sulphides, vinyl ethers, cyclic ethers, cyclic formals and acetals, lactones, or siloxanes.

16. The method of claim 10 wherein the monomer layers have a cured thickness of from 5 to 150 micrometers.

17. The method of claim 10 wherein the photoinitiator is selected from the group consisting of diazonium salts, diaryliodonium salts, triarylsulphonium salts, dialkylphenacyl-sulfonium salts, ferrocenium salts, α-sulphonyloxy ketones, and silyl benzyl ethers.

18. The method of claim 10 wherein the photoinitiator is present in an amount of about 0.5 to 6 weight percent relative to the monomer.

* * * * *